(12) United States Patent
Shim et al.

(10) Patent No.: US 7,388,280 B2
(45) Date of Patent: Jun. 17, 2008

(54) PACKAGE STACKING LEAD FRAME SYSTEM

(75) Inventors: IL Kwon Shim, Singapore (SG); Ming Ying, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 55 days.

(21) Appl. No.: 11/163,770

(22) Filed: Oct. 29, 2005

(65) Prior Publication Data

US 2006/0186514 A1    Aug. 24, 2006

Related U.S. Application Data

(60) Provisional application No. 60/593,890, filed on Feb. 22, 2005.

(51) Int. Cl.
    *H01L 23/495* (2006.01)
(52) U.S. Cl. ............ 257/666; 257/678; 257/670; 257/686; 257/E23.04; 257/E23.043
(58) Field of Classification Search .......... 257/670, 257/E23.004, 777, E23.043
    See application file for complete search history.

(56) References Cited

U.S. PATENT DOCUMENTS

| | | | | |
|---|---|---|---|---|
| 4,956,694 | A | 9/1990 | Eide | 357/686 |
| 5,484,959 | A | 1/1996 | Burns | 174/524 |
| 6,652,291 | B2 | 11/2003 | Worz | 439/69 |
| 6,791,166 | B1 | 9/2004 | Foster | 257/666 |
| 6,806,120 | B2 | 10/2004 | Wehrly, Jr. | 438/109 |
| 2002/0130400 | A1* | 9/2002 | Jeong et al. | 257/670 |
| 2004/0232527 | A1* | 11/2004 | Ito et al. | 257/666 |
| 2004/0251526 | A1* | 12/2004 | Hur et al. | 257/678 |
| 2005/0001294 | A1* | 1/2005 | Li et al. | 257/666 |

* cited by examiner

*Primary Examiner*—Long K Tran
(74) *Attorney, Agent, or Firm*—Mikio Ishimaru

(57) ABSTRACT

The present invention provides a package stacking lead frame system comprising forming a lead frame interposer including a dual row of terminal leads positioned around a die attach pad, mounting a first die on the die attach pad, wherein the first die is connected to the dual row of terminal leads, molding a molding compound around the first die and the dual row of terminal leads and mounting a second integrated circuit package on the lead frame interposer, wherein the second integrated circuit package size is independent of the first die size.

20 Claims, 8 Drawing Sheets

PACKAGE STACKING LEAD FRAME SYSTEM

CROSS-REFERENCE TO RELATED APPLICATION

This application claims the benefit of U.S. Provisional Patent Application Ser. No. 60/593,890 filed Feb. 22, 2005, and the subject matter thereof is hereby incorporated herein by reference thereto.

TECHNICAL FIELD

The present invention relates generally to integrated circuit package systems, and more particularly to a system for semiconductor package stacking.

BACKGROUND ART

Ongoing goals of the computer industry include higher performance, lower cost, increased miniaturization of components, and greater packaging density of integrated circuits ("IC's"). As new generations of IC products are released, their functionality increases while the number of components needed to fabricate them decreases.

Integrated circuits are constructed from a semiconductor wafer through a process that comprises a number of deposition, masking, diffusion, etching, and implanting steps. Usually, many individual devices are constructed on the same wafer. When the IC's are separated into individual rectangular units, each takes the form of an IC die. In order to interface a die with other circuitry, it is common to mount it on a lead frame or on a multi-chip module substrate that is surrounded by a number of lead fingers. Each die has pads that are then individually connected in a wire bonding or flip chip operation to the lead frame's lead fingers using extremely fine wires or solder balls. The assemblies are then packaged by individually encapsulating them in molded plastic or ceramic bodies.

To further condense the packaging of individual devices, packages have been developed in which more than one device can be packaged on a package site of a lead frame strip. Each package site on a lead frame strip is a structure that provides mechanical support for the individual IC dice. It also provides one or more layers of interconnect lines that enable the devices to be connected electrically to surrounding circuitry. Various chip-on-board ("COB") techniques are used to attach different semiconductor die to a printed circuit board ("PCB"). COB techniques include flip chip attachment, wire bonding, and tape automated bonding ("TAB").

In some cases, multi-chip devices can be fabricated faster and more cheaply than a corresponding single IC chip that incorporates all the same functions. Current multi-chip modules typically consist of a PCB substrate onto which a set of separate IC chip components is directly attached. Such multi-chip modules have been found to increase circuit density and miniaturization, improve signal propagation speed, reduce overall device size and weight, improve performance, and lower costs, all of which are primary goals of the computer industry.

However, such multi-chip modules can be bulky. The area required to mount a die or module on a circuit board determines the IC package density. One method for reducing the board size of multi-chip modules and thereby increase their effective density is to stack the die or chips vertically within the module or package. In one design, a pair of IC die is mounted on opposite sides of a lead frame paddle. Gold or aluminum wires then connect the wire bonding pads on both the upper die and the lower die with the ends of their associated lead frame lead extensions.

Other representative designs for mounting multiple semiconductor IC chips in a single, multi-chip package include: two chips mounted on two lead frame paddles, one chip mounted over a paddle and one below mounted on a board, and one chip attached on top of a larger chip that is attached below to a paddle. These and other configurations have also been extended to include three or more chips mounted together vertically in a single package.

However, multi-chip modules, whether vertically or horizontally arranged, can also present problems because they usually must be assembled before the component chips and chip connections can be tested. The electrical bond pads on a die are so small, it is difficult to test die before assembly onto a substrate. Thus, when die are mounted and connected individually, the die and connections can be tested individually, and only known-good-die ("KGD"), free of defects, are then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Two of the common die stacking methods are: (a) larger lower die combined with a smaller upper die, and (b) so-called same-size die stacking. With the former, the die can be very close vertically since the electrical bond pads on the perimeter of the lower die extend beyond the edges of the smaller die on top. With same-size die stacking, the upper and lower die are spaced more vertically apart to provide sufficient clearance for the wire bonds to the lower die. As discussed, both these methods have inherent KGD and assembly process yield loss disadvantages since KGD cannot be used for fabricating these configurations.

Another previous design is package level stacking. This concept includes stacking of two or more packages. KGD and assembly process yields are not an issue since each package can be tested prior to assembly, allowing KGD to be used in assembling the stack. But package level stacking can pose other problems. One problem is package-to-package assembly process difficulties caused by irregularities in the flatness or co-planarity of the lower package. Another problem results from the increased stiffness of the overall assembly, which can lead to reduced board level reliability. Still another problem can arise from poor heat dissipation from the upper package.

Thus, despite the improvements of recent developments in semiconductor fabrication and packaging techniques, there is a continuing need for enhanced packaging methods, systems, and designs for increasing semiconductor die density in PCB assemblies. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a package stacking lead frame system comprising forming a lead frame interposer including a dual row of terminal leads positioned around a die attach pad, mounting a first die on the die attach pad, wherein the first die is connected to the dual row of terminal leads, molding a molding compound around the first die and the dual row of terminal leads and mounting a second integrated circuit package on the lead frame interposer, wherein the second integrated circuit package size is independent of the first die size.

Certain embodiments of the invention have other aspects in addition to or in place of those mentioned or obvious from the above. The beneficial aspects will become apparent to those skilled in the art from a reading of the following detailed description when taken with reference to the accompanying drawings.

BEST MODE FOR CARRYING OUT THE INVENTION

Figure 1:
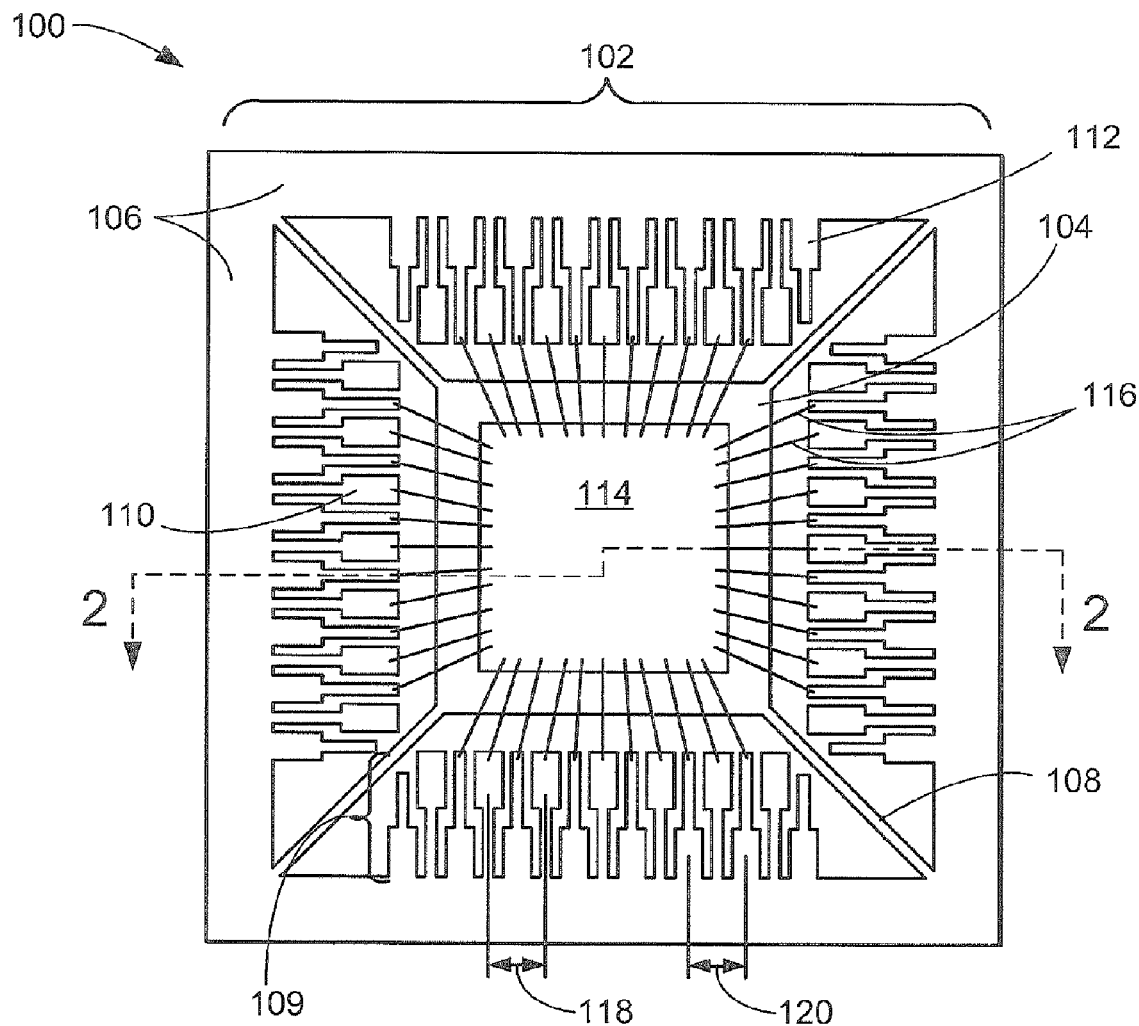
FIG. 1 is a top view of a package stacking lead frame system, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the device are semi-diagrammatic and not to scale and, particularly, some of the dimensions are for the clarity of presentation and are shown greatly exaggerated in the drawing FIGS. Generally, the device can be operated in any orientation. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the lead frame regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material, patterning, exposure, development, etching, cleaning, and/or removal of the material as required in forming a described structure.

Referring now to FIG. 1, therein is shown a top view of a package stacking lead frame system 100, in an embodiment of the present invention. The package stacking lead frame system 100 includes a first lead frame interposer 102 having a first die attach pad 104, in the center of the first lead frame interposer 102, a first dam bar 106, tie bars 108, and a dual row of terminal leads 109, such as a staggered or inline dual row having bottoms partially etched, comprising internal terminal leads 110 and external terminal leads 112, positioned around the first die attach pad 104. A first die 114 attached to the first die attach pad 104 and bond wires 116 electrically connecting the first die 114 to the internal terminal leads 110.

The first die 114 may be any size that fits on the first die attach pad 104, supported by the tie bars 108. The bond wires 116 may attach the first die 114 to as many of the internal terminal leads 110 or the external terminal leads 112 as required. An internal terminal lead spacing 118 represents the lead pitch of the internal terminal leads 110. An external terminal lead spacing 120 the lead pitch of the external terminal leads 112. For illustrative purposes, the internal terminal lead spacing 118 and the external terminal lead spacing 120 are shown of equal spacing, although it is understood that they may differ as well. In this way integrated circuits of different complexities can be adapted for semiconductor package stacking.

The first lead frame 102 may support as many of the internal terminal leads 110 and the external terminal leads 112 as desired. The configuration of FIG. 1 is an example and may be larger or smaller as required for the technology being supported. The package stacking lead frame system 100 can be tested after the integrated circuit is mounted, allowing the best practice of utilizing known good die (KGD) to assemble stacked devices.

Figure 2:
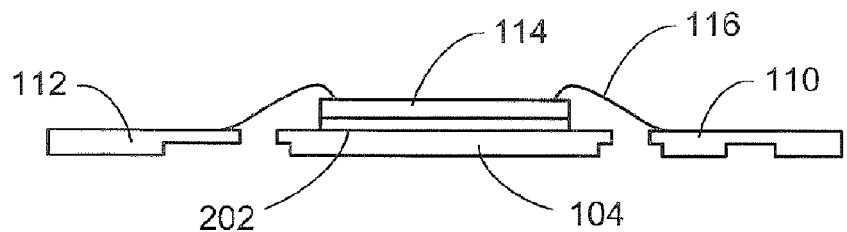
FIG. 2 is a cross-sectional view of the package stacking lead frame system taken along the 2-2 line of FIG. 1.

Referring now to FIG. 2, therein is shown a cross-sectional view of the package stacking lead frame system 100 taken along the 2-2 line of FIG. 1. The cross-sectional view shows the partially etched profiles of the internal terminal leads 110, the external terminal leads 112 and the first die attach pad 104. The first die 114 attaches to the first die attach pad 104 by a die attach adhesive 202. The bond wires 116 make physical and electrical connections between the first die 114 and the internal terminal leads 110, and the partially etched leadtips of the external terminal leads 112. The spacing between the internal terminal leads 110, the external terminal leads 112 and etched areas allow molding compound to flow around the internal terminal leads 110 and the external terminal leads 112 during molding.

Figure 3:
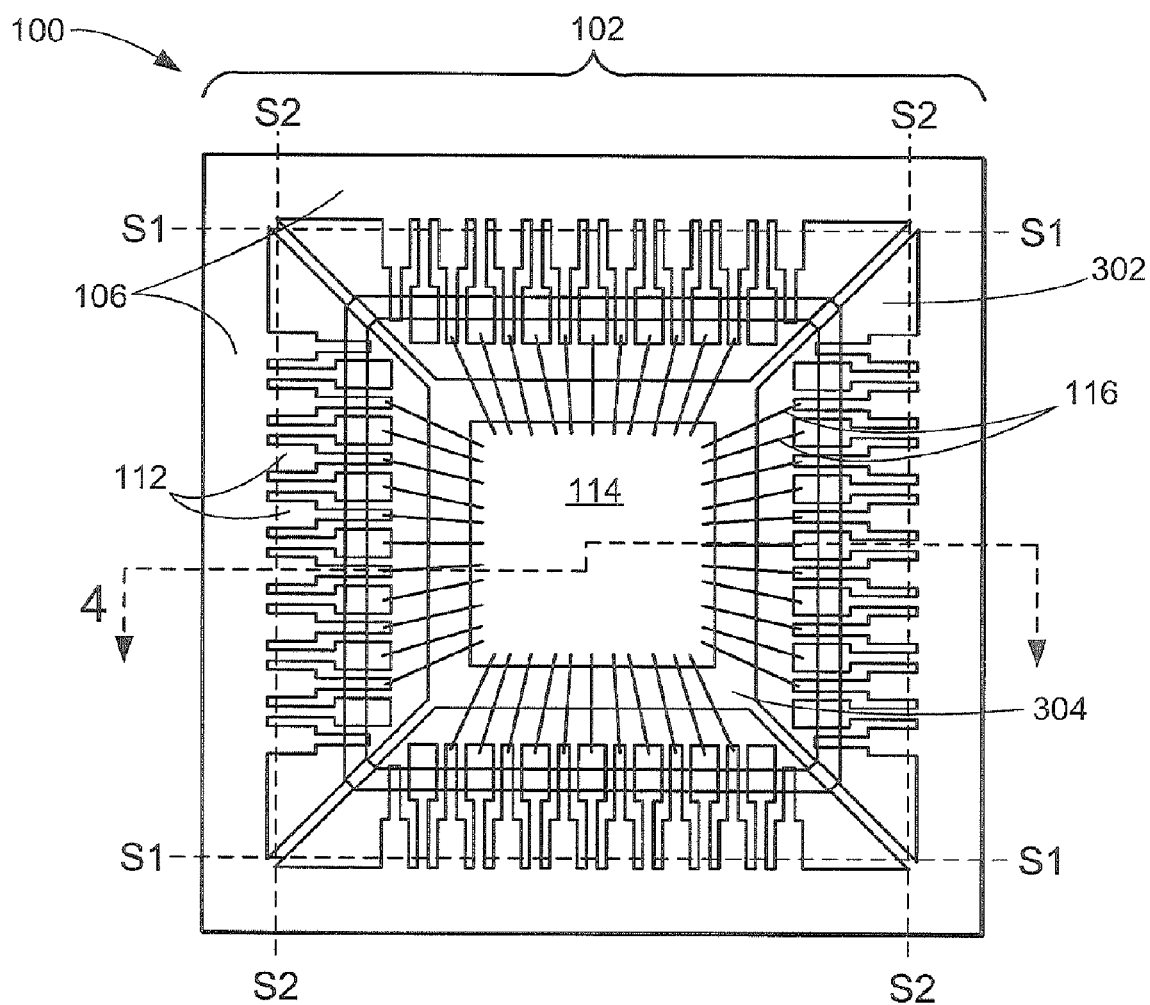
FIG. 3 is a top view of the package stacking lead frame system of FIG. 1 in a molding phase.

Referring now to FIG. 3, therein is shown a top view of the package stacking lead frame system 100 of FIG. 1 in a molding phase. The top view shows a molding compound 302, such as a semi-transparent or opaque molding compound, used to encapsulate the first die 114 and form a first mold cap 304. The molding compound 302 is shown as semi-transparent and displays the internal structure of the first lead frame 102, the first die 114 or the bond wires 116. The role of the molding compound 302 is to provide mechanical protection for the first die 114 and the bond wires 116, mechanical support for the external terminal leads 112 and to form the solder resist regions defining the solder wettable areas around the internal terminal leads 110 and the external terminal leads 112. The first dam bar 106 will be separated from the finished package along section lines S1-S1 and S2-S2. The singulation of the package may be performed in any number of processes, such as with a saw or edge punch process. The process and apparatus for manufacturing the package stacking lead frame system 100 is the same as that of a quad flat no-lead (QFN) package.

Figure 4:
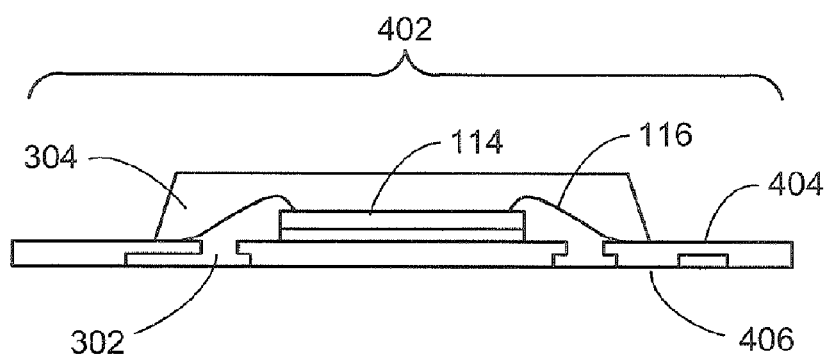
FIG. 4 is a cross-sectional view of the package stacking lead frame system taken along the 4-4 line of FIG. 3.

Referring now to FIG. 4, therein is shown a cross-sectional view of the package stacking lead frame system 100 taken along the 4-4 line of FIG. 3. The cross-sectional view shows a first QFN-like package 402, having a first package top 404 and a first package bottom 406. This package style allows electrical connection utilizing the first package top 404 and the first package bottom 406. The molding compound 302 forms the first mold cap 304 protecting the first die 114 and the bond wires 116.

Figure 5:
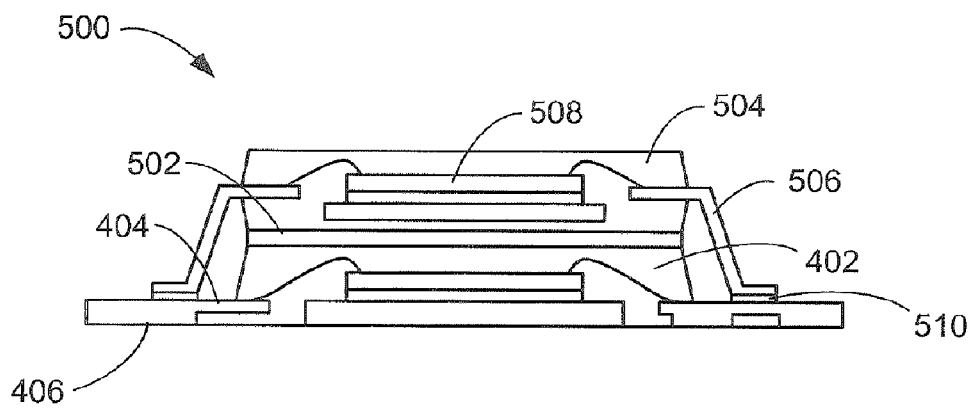
FIG. 5 is a cross-sectional view of a first package stacking structure using the package stacking lead frame system of FIG. 1.

Referring now to FIG. 5, therein is shown a cross-sectional view of a first package stacking structure 500 using the package stacking lead frame system 100 of FIG. 1. The first package stacking structure 500 includes the first QFN-like package 402, a conductive adhesive member 502 and a second integrated circuit package 504. The second integrated circuit package 504 includes interconnect structures 506 and a second die 508. The interconnect structures 506, such as gull-wing leads, "J" leads, solder columns or solder balls, are examples of the connection types available for the first QFN-like package 402. The interconnect structures 506, of the second integrated circuit package 504, electrically attach to the first QFN-like package 402 with a solder paste 510. The first package stacking structure 500 may attach to a PCB (not shown), utilizing any number of processes, such as a re-flow process, that melts the solder paste 510 and forms an electrical connection between the interconnect structures 506, the first QFN-like package 402 and the PCB (not shown).

The second integrated circuit package 504 is shown as having the second die 508 of approximately the same size as the first die 114, but the relative size of the first die 114 and the second die 508 is completely independent. The first die 114 can be a small device, such as a power conditioning chip, while the second integrated circuit package 504 can be a large device, such as a memory array chip. The common leads between the two functions can be connected in the structure of the first lead frame interposer 102, simplifying the PCB design. The first package stacking structure 500 may mount on a PCB (not shown) supplying complimentary chip functions in the same circuit board space.

Figure 6:
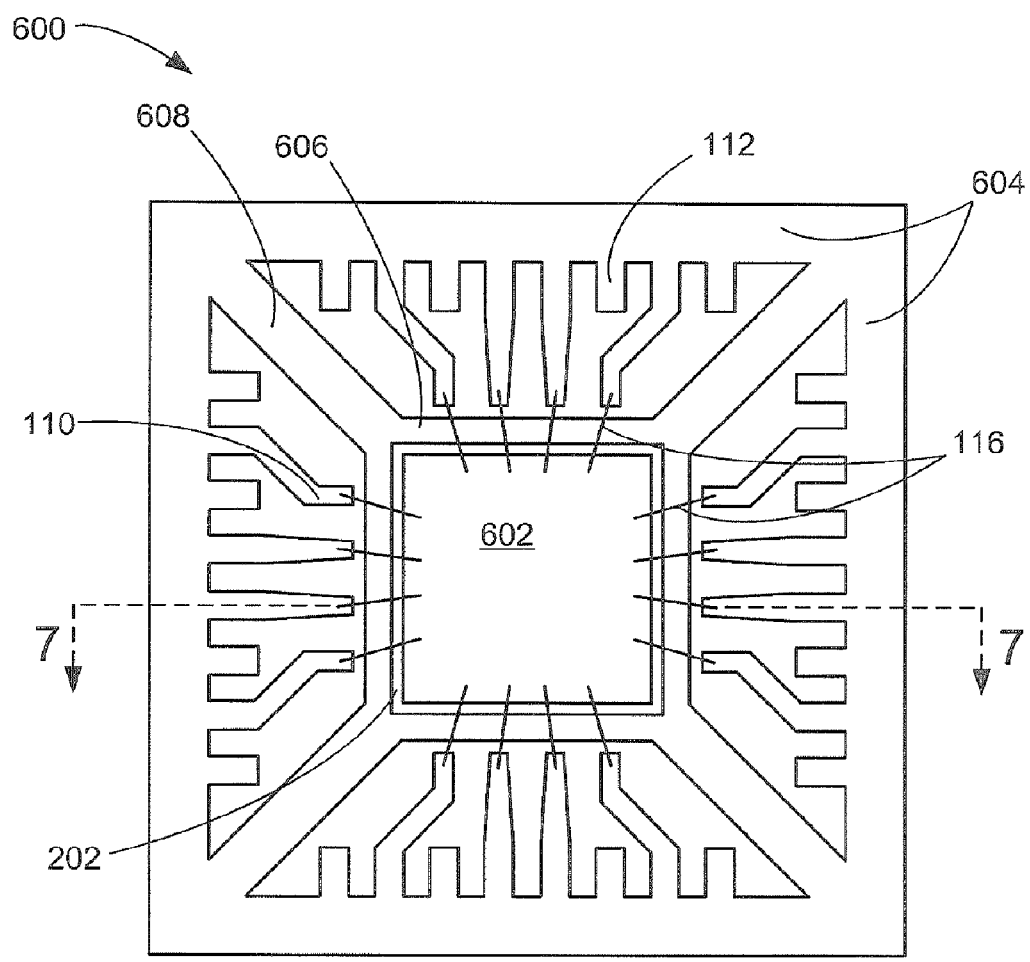
FIG. 6 is a top view of the package stacking lead frame system, in an alternative embodiment of the present invention.

Referring now to FIG. 6, therein is shown a top view of the package stacking lead frame system 600, in an alternative embodiment of the present invention. The package stacking lead frame system 600 includes a smaller die 602, a second dam bar 604, second tie bars 608, the internal terminal leads 110, partially etched on the bottom, the external terminal leads 112, also partially etched on the bottom, and the bond wires 116. A second die attach pad 606, stabilized by the second tie bars 608, and the die attach adhesive 202 is used to mount the smaller die 602. The bond wires 116 electrically connect between the smaller die 602 and the internal terminal leads 110.

Figure 7:
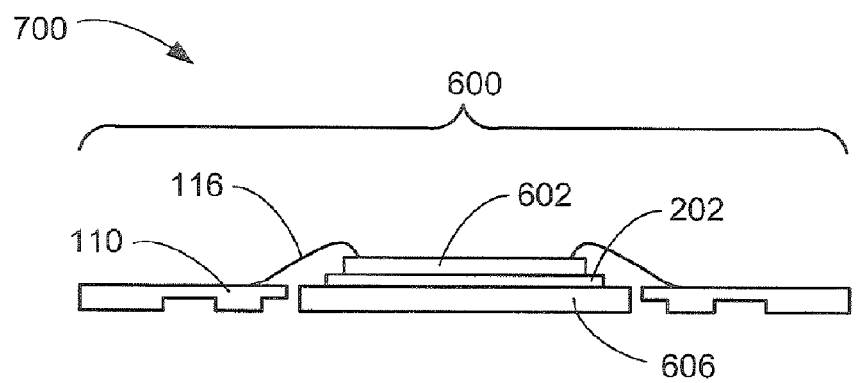
FIG. 7 is a cross-sectional view of the package stacking lead frame system taken along the 7-7 line of FIG. 6.

Referring now to FIG. 7, therein is shown a cross-sectional view of the package stacking lead frame system 600 taken along the 7-7 line of FIG. 6. The cross-sectional view shows the partially etched profiles of the internal terminal leads 110 and the second die attach pad 606. The smaller die 602 is attached to the second die attach pad 606 by the die attach adhesive 202. The bond wires 116 electrically connect the smaller die 602 and the internal terminal leads 110. The spacing between the internal terminal leads 110, the external terminal leads 112 and etched areas allow molding compound to flow around the internal terminal leads 110 and the external terminal leads 112 during molding.

Figure 8:
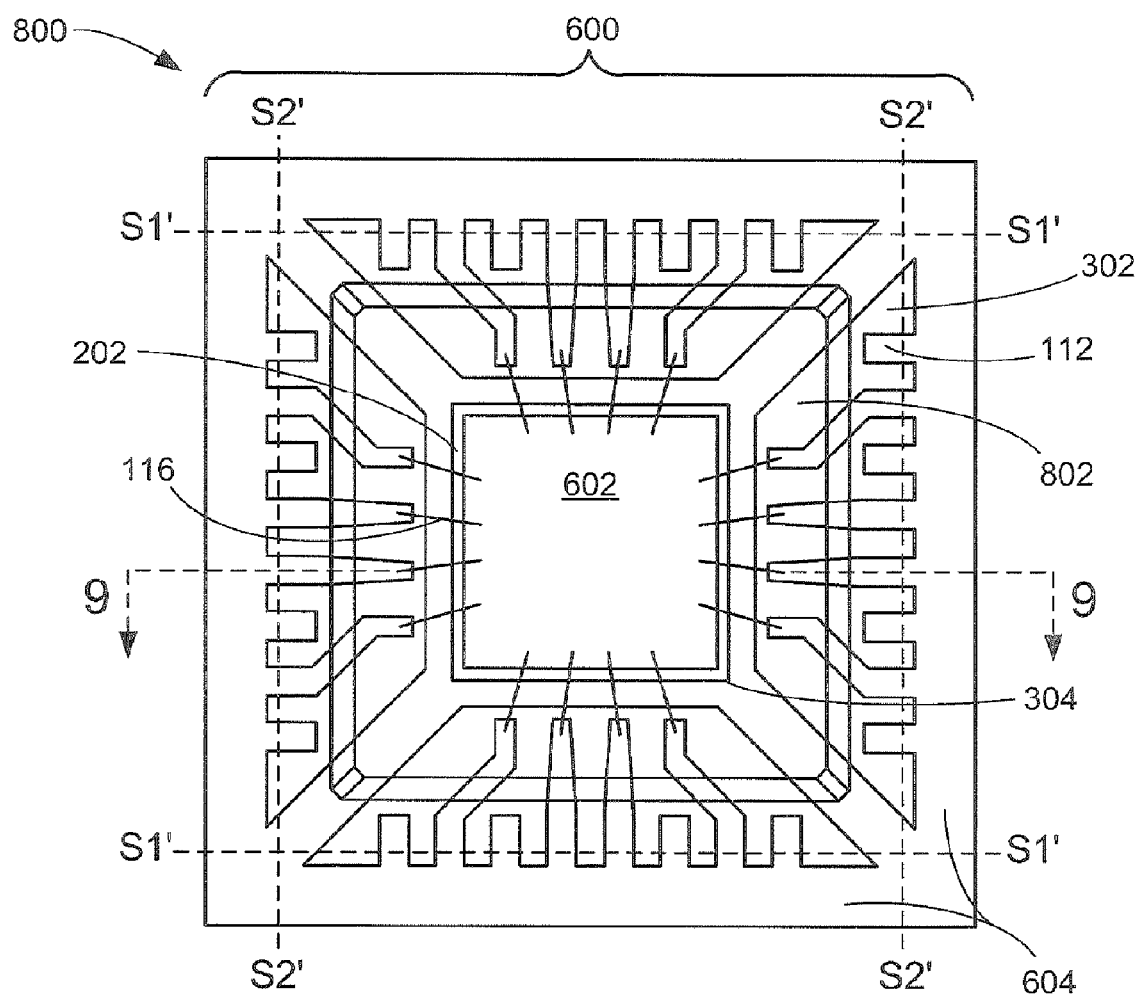
FIG. 8 is a top view of the package stacking lead frame system of FIG. 6 in a molding phase.

Referring now to FIG. 8, therein is shown a top package view of the package stacking lead frame system 600 of FIG. 6 in the molding phase. The top package view shows the molding compound 302 used to encapsulate the smaller die 602 and form a second mold cap 802. The molding compound 302 is shown as semi-transparent and displays the internal structure of the package stacking lead frame system 600, the smaller die 602, the die attach adhesive 202 or the bond wires 116. The molding compound 302 provides mechanical protection of the smaller die 602 and the bond wires 116, mechanical support for the external terminal leads 112 and to serve as the solder resist region, defining the solder wettable areas around the dual row of terminal leads 109. The second dam bar 604 will be separated from the finished package along section lines S1'-S1' and S2'-S2'. The singulation of the package may use any number of processes, such as a saw or edge punch process. The singulated package is shown in FIG. 10.

Figure 9:
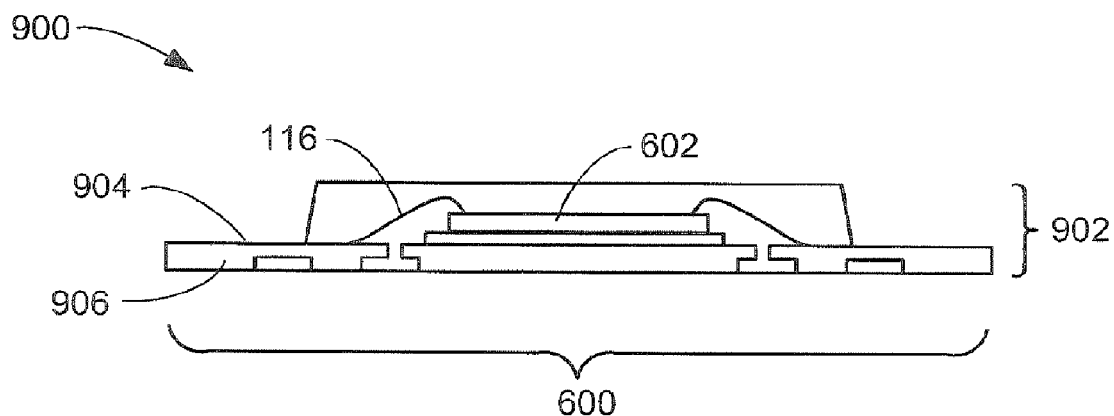
FIG. 9 is a cross-sectional view of the package stacking lead frame system taken along the 9-9 line of FIG. 8.

Referring now to FIG. 9, therein is shown a cross-sectional view of the package stacking lead frame system 600 taken along the 9-9 line of FIG. 8. The package cross-sectional view shows a second QFN-like package 902, having a second package top 904 and a second package bottom 906. This package style allows electrical connection utilizing the second package top 904 and the second package bottom 906.

Figure 10:
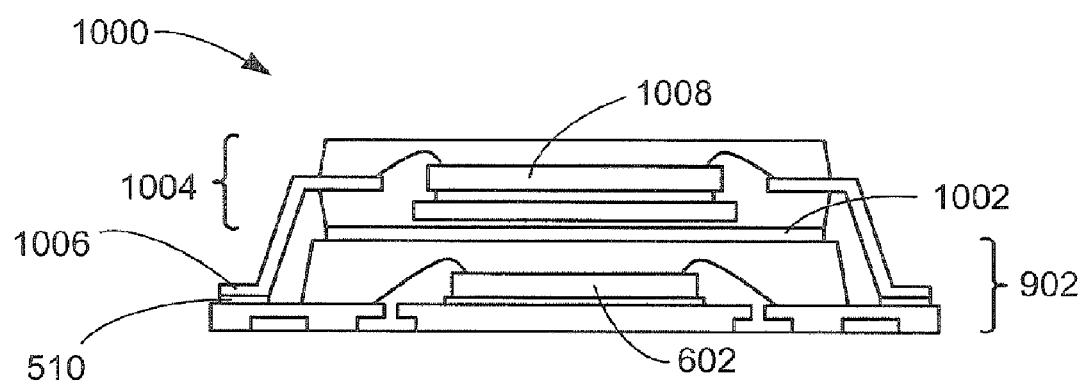
FIG. 10 is a cross-sectional view of a second package stacking structure using the second QFN-like package of FIG. 9.

Referring now to FIG. 10, therein is shown a cross-sectional view of a second package stacking structure 1000 using the second QFN-like package 902 of FIG. 9. The second package stacking structure 1000 includes the second QFN-like package 902, an optional adhesive member 1002 and a fourth integrated circuit package 1004, having interconnect structures 1006 and a fourth die 1008. The interconnect structures 1006, such as gull-wing leads, "J" leads, solder columns or solder balls, electrically attach to the second QFN-like package 902 with the solder paste 510. The second package stacking structure 1000 may attach to a PCB (not shown) in any number of processes, such as a re-flow process, that melts the solder paste 510 and forms an electrical connection between the interconnect structures 1006, the second QFN-like package 902 and the PCB (not shown). The fourth integrated circuit package 1004 may also have a "J-lead" connection system (not shown) to attach to the second QFN-like package 902.

The fourth integrated circuit package 1004 is shown as having the fourth die 1008 of significantly larger size than the smaller die 602, but the relative size of the fourth die 1008 and the smaller die 602 is completely independent. The second package stacking structure 1000 may mount on a PCB (not shown) supplying complimentary chip functions in the same circuit board space.

Figure 11:
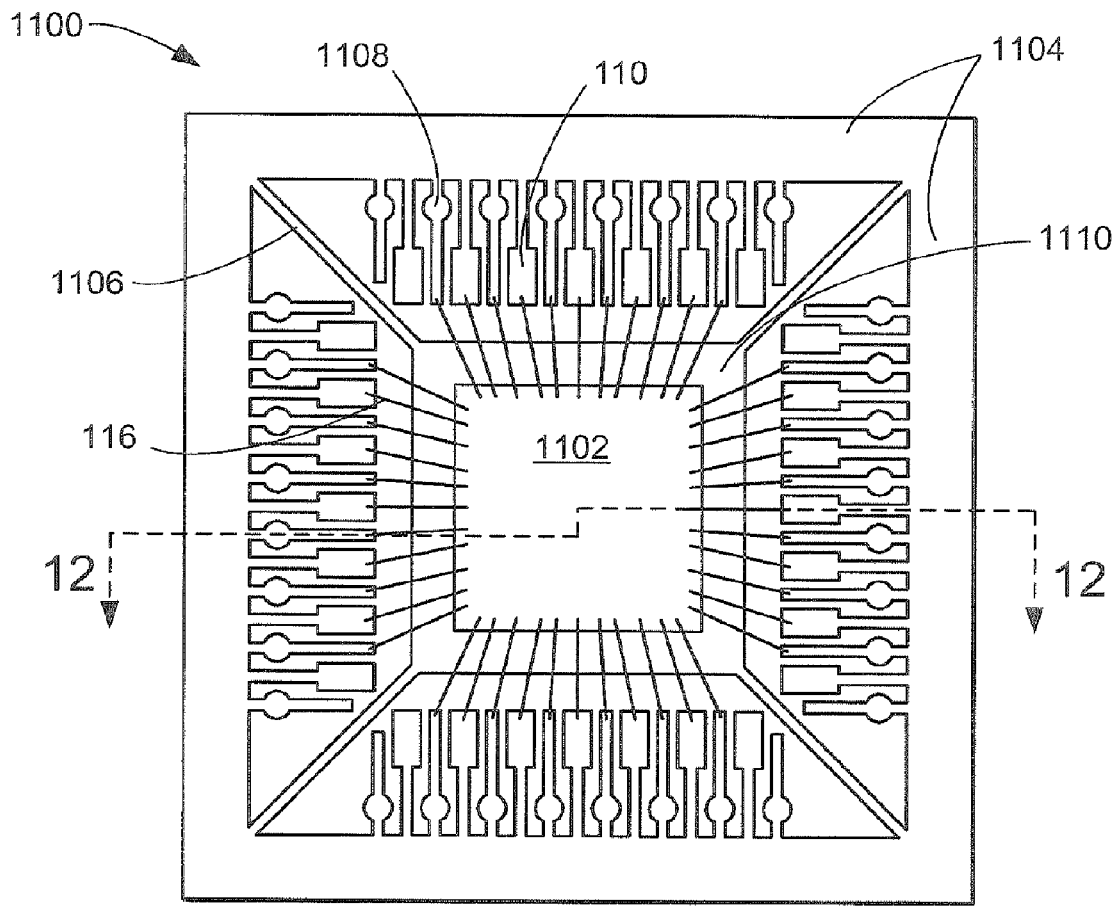
FIG. 11 is a top view of the package stacking lead frame system, in another alternative embodiment of the present invention.

Referring now to FIG. 11, therein is shown a top view of the package stacking lead frame system 1100, in another alternative embodiment of the present invention. The package stacking lead frame system 1100 includes a larger die 1102, a third dam bar 1104, third tie bars 1106, the internal terminal leads 110, partially etched on the bottom, external ball grid terminal leads 1108 and the bond wires 116. A third die attach pad 1110, stabilized by the third tie bars 1106, is used to mount the larger die 1102. The bond wires 116 electrically connect the larger die 1102 and the internal terminal leads 110.

Figure 12:
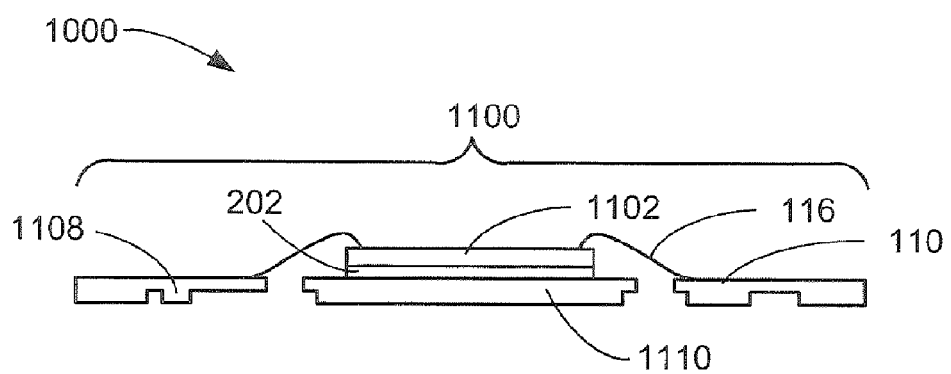
FIG. 12 is a cross-sectional view of the package stacking lead frame system taken along the 12-12 line of FIG. 11.

Referring now to FIG. 12, therein is shown a cross-sectional view of the package stacking lead frame system 1100 taken along the 12-12 line of FIG. 11. The cross-sectional view shows the partially etched profiles of the internal terminal leads 110 and the third die attach pad 1110. The larger die 1102 is attached to the third die attach pad 1110 by the die attach adhesive 202. The bond wires 116 electrically connect the larger die 1102 and the internal terminal leads 110. The spacing between the internal terminal leads 110, the external terminal leads 112 and etched areas allow molding compound to flow around the internal terminal leads 110 and the external ball grid terminal leads 1108 during molding.

Figure 13:
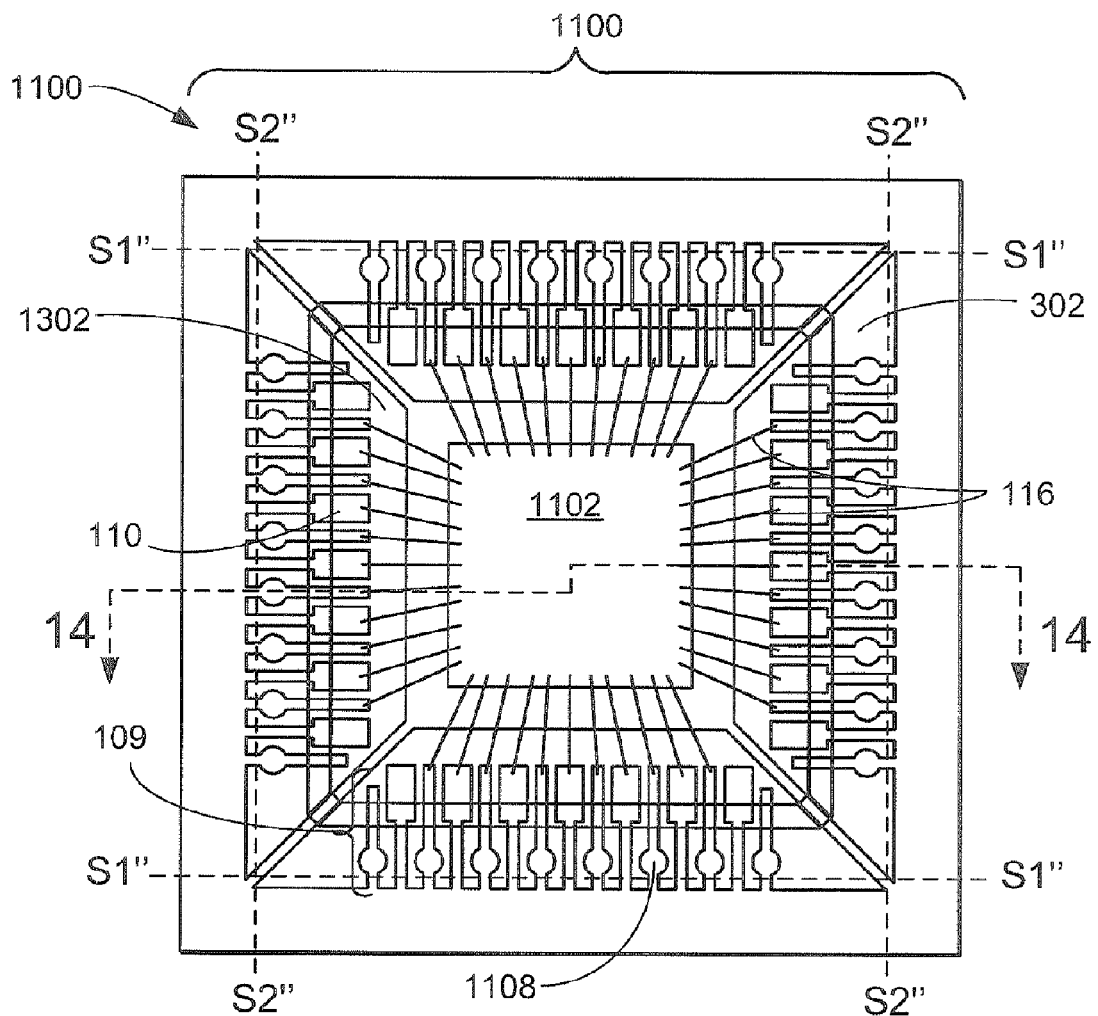
FIG. 13 is a top view of the package stacking lead frame system of FIG. 11 in a molding phase.

Referring now to FIG. 13, therein is shown a top package view of the package stacking lead frame system 1100 of FIG. 11 in the molding phase. The top package view shows the molding compound 302 used to encapsulate the larger die 1102 and form a third mold cap 1302. The molding compound 302 is shown as semi-transparent and displays the internal structure of the package stacking lead frame system 1100, the larger die 1102 and the bond wires 116. The molding compound 302 provides mechanical protection of the larger die 1102 and the bond wires 116, mechanical support for the external ball grid terminal leads 1108 and to serve as the solder resist defining the solder wettable areas around the dual row of terminal leads 109. The third dam bar 1104 will be separated from the finished package along section lines S1"-S1" and S2"-S2". The singulation of the package may be performed in any number of processes, such as a saw or edge punch process. The singulated package is shown in FIG. 15.

Figure 14:
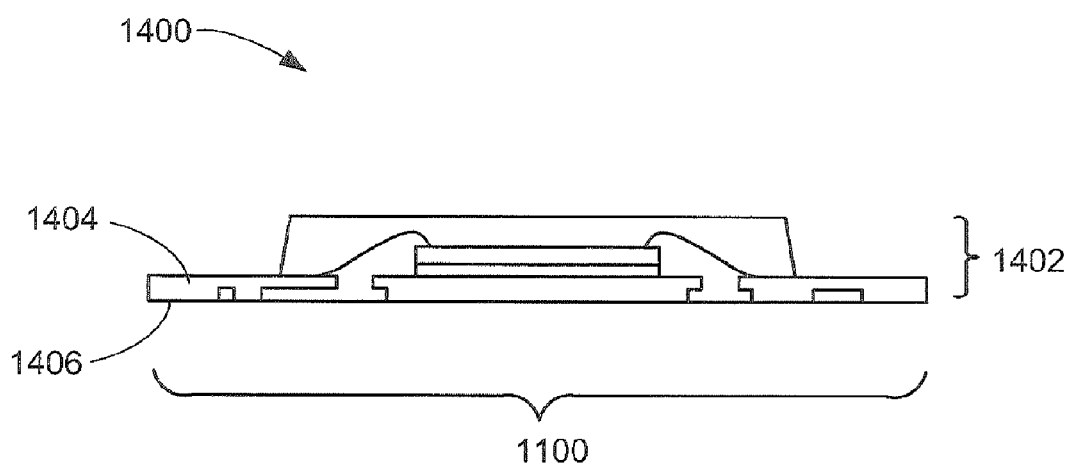
FIG. 14 is a cross-sectional view of the package stacking lead frame system taken along the 14-14 line of FIG. 13.

Referring now to FIG. 14, therein is shown a cross-sectional view of the package stacking lead frame system 1100 taken along the 14-14 line of FIG. 13. The cross-sectional view shows a third QFN-like package 1402, having a third package top 1404 and a third package bottom 1406. This package style allows electrical connection of a second integrated circuit package from the third package top 1404 and the third package bottom 1406. The third QFN-like package 1402 can be electrically connected to a PCB (not shown) in several ways. The application of this unique package is shown in the following figures.

Figure 15:
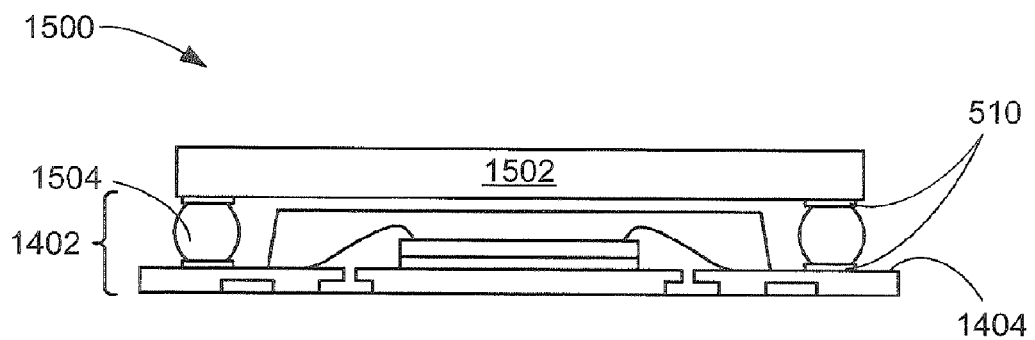
FIG. 15 is a cross-sectional view of a third package stacking structure using the third QFN-like package of FIG. 14.

Referring now to FIG. 15, therein is shown a cross-sectional view of a third package stacking structure 1500 using the third QFN-like package 1402 of FIG. 14. The third package stacking structure 1500 includes the third QFN-like package 1402, and a sixth integrated circuit package 1502, having a solder ball interface 1504. The solder ball interface 1504 of the sixth integrated circuit package 1502 electrically attaches to the third QFN-like package 1402 with the solder paste 510. The third package stacking structure 1500 may attach to a PCB (not shown) in any number of processes, such as a re-flow process, that melts the solder paste 510 and forms an electrical connection between the solder ball interface 1504, the third QFN-like package 1402 and the PCB (not shown). The sixth integrated circuit package 1502 may also have a solder column (not shown) or stud bump connection system (not shown) to attach to the third QFN-like package 1402.

The sixth integrated circuit package 1502 is shown electrically connected to the third package top 1404. The third package stacking structure 1500 can easily mount on a PCB (not shown) supplying complimentary functions in the same circuit board space.

Figure 16:
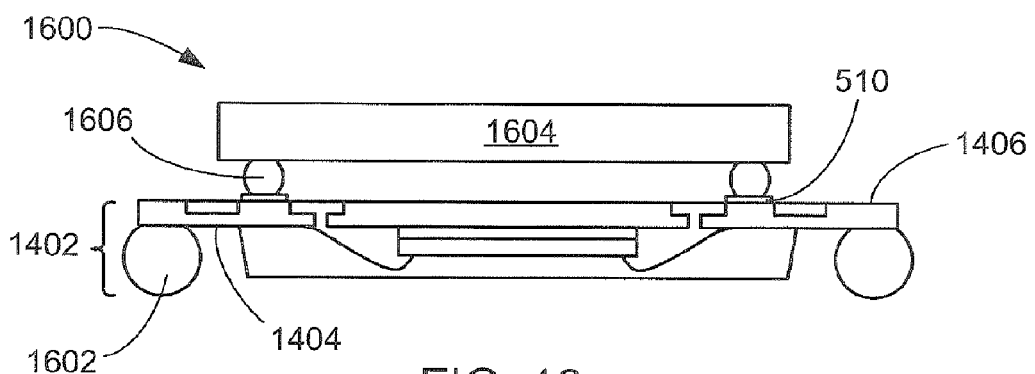
FIG. 16 is a cross-sectional view of the package stacking lead frame system in yet another alternative embodiment of the present invention.

Referring now to FIG. 16, therein is shown a cross-sectional view of the fourth package stacking structure 1600 in yet another alternative embodiment of the present invention. The cross-sectional view of the fourth package stacking structure 1600 uses the third QFN-like package 1402, in an inverted position, and includes solder balls 1602 attached to the third package top 1404, while attaching a seventh integrated circuit package 1604 with solder ball interface 1606 to the third package bottom 1406 with the solder paste 510. The fourth package stacking structure 1600 may attach to a PCB (not shown) in any number of processes, such as a re-flow process, that melts the solder paste 510 and forms an electrical connection between the solder ball interface 1606, the third QFN-like package 1402 and the PCB (not shown). The seventh integrated circuit package 1604 may also have a solder column (not shown) or stud bump connection system (not shown) to attach to the third QFN-like package 1402, likewise the same connection systems could be used to attach the third QFN-like package 1402 to the PCB (not shown).

Figure 17:
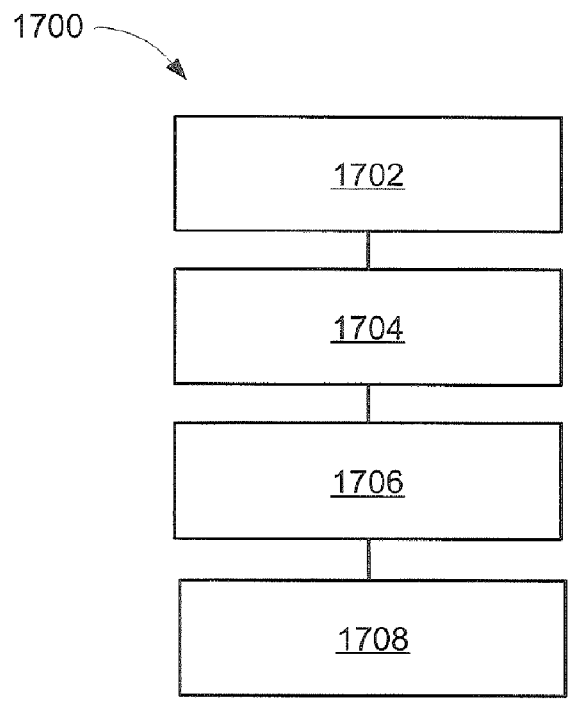
FIG. 17 is a flow chart of a system of package stacking lead frame in an embodiment of the present invention.

Referring now to FIG. 17, therein is shown a flow chart of a system 1700 of package stacking lead frame system in an embodiment of the present invention. The system 1700 includes forming a lead frame interposer including a dual row of terminal leads positioned around a die attach pad in a block 1702; mounting a first die on the die attach pad, wherein the first die is connected to the dual row of terminal leads in a block 1704; molding a molding compound around the first die and the dual row of terminal leads in a block 1706; and mounting a second integrated circuit package on the lead frame interposer, wherein the second integrated circuit package size is independent of the first die size in a block 1708.

An aspect is that the present invention allows stacking of integrated circuits independent of the relative die size of the two integrated circuits. Another aspect is that supporting functions can be stacked to share interconnect functions allowing a simplification of the printed circuit board layout.

It has been discovered that lead frame interposer can be designed to allow shielding between the two integrated circuits which can allow stacking of functions that heretofore had to be physically separated on the printed circuit board, thus offering a further simplification of the printed circuit board layout. Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the lead frame system for the application of semiconductor package method and apparatus of the present invention furnish important and heretofore unknown and unavailable solutions, capabilities, and functional aspects for integrated circuit packaging and printed circuit board layout. The resulting processes and configurations are straightforward, cost-effective, uncomplicated, highly versatile and effective, can be implemented by adapting known technologies, and are thus readily suited for efficiently and economically manufacturing package stacking devices fully compatible with conventional manufacturing processes and technologies. The resulting processes and configurations are accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A package stacking lead frame system comprising:
   forming a lead frame interposer including a dual row of terminal leads positioned around a die attach pad;
   mounting a first die on the die attach pad, wherein the first die is connected to the dual row of terminal leads;
   molding a molding compound around the first die and the dual row of terminal leads; and
   mounting a second integrated circuit package on the lead frame interposer, wherein the second integrated circuit package size is independent of the first die size.

2. The system as claimed in claim 1 wherein mounting the first die on the die attach pad comprises connecting bond wires to the first die and the dual row of terminal leads.

3. The system as claimed in claim 1 wherein molding the molding compound comprises forming a QFN-like package and mounting the second integrated circuit package to the dual row of terminal leads.

4. The system as claimed in claim 1 further comprising forming solder resist regions and solder wettable areas by the molding compound around the dual row of terminal leads.

5. The system as claimed in claim 1 wherein forming the lead frame interposer including the dual row of terminal leads comprises forming internal terminal leads and external terminal leads.

6. A package stacking lead frame system comprising:
   forming a lead frame interposer comprises:
      providing a die attach pad in a center of the lead frame interposer;
      utilizing a dual row of terminal leads, having internal terminal leads and external terminal leads, positioned around the die attach pad;
      providing dam bars attached to the dual row of terminal leads; and
      forming tie bars between the dam bars and the die attach pad;
   mounting a first die on the die attach pad wherein the first die is connected to the internal terminal leads;
   molding a molding compound around the first die and the dual row of terminal leads further comprises forming a QFN-like package; and
   mounting a second integrated circuit package on the lead frame interposer, wherein a large second integrated circuit package is mounted over a smaller first die.

7. The system as claimed in claim 6 wherein mounting the first die on the die attach pad comprises connecting bond wires to the first die and the internal terminal leads.

8. The system as claimed in claim 6 further comprising forming a mounting surface for the second integrated circuit package above the QFN-like package of the lead frame interposer.

9. The system as claimed in claim 6 further comprising utilizing interconnect structures to electrically connect the second integrated circuit package mounted above the lead frame interposer to the external terminal leads.

10. The system as claimed in claim 6 further comprises etching partially the internal terminal leads and the external terminal leads allowing the molding compound to flow around and support the leads.

11. A package stacking lead frame system comprising:
    a lead frame interposer having a dual row of terminal leads positioned around a die attach pad;
    a first die mounted on the die attach pad, comprises the first die electrically connected to the dual row of terminal leads;
    a molding compound molded around the first die and the dual row of terminal leads; and
    a second integrated circuit package mounted on the lead frame interposer, wherein the second integrated circuit package size is independent of the first die size.

12. The system as claimed in claim 11 further comprising bond wires that connect the first die to the dual row of terminal leads.

13. The system as claimed in claim 11 further comprising a QFN-like package formed of the lead frame interposer with the second integrated circuit package mounted to the dual row of terminal leads.

14. The system as claimed in claim 11 further comprising solder resist regions and solder wettable areas formed by the molding compound around the dual row of terminal leads.

15. The system as claimed in claim 11 wherein the lead frame interposer including the dual row of terminal leads comprises internal terminal leads and external terminal leads.

16. The system as claimed in claim 11 wherein the lead frame interposer having the dual row of terminal leads positioned around the die attach pad, the first die mounted on the die attach pad, comprises the first die electrically connected to the dual row of terminal leads, the molding compound molded around the first die and the dual row of terminal leads and the second integrated circuit package mounted on the lead frame interposer, wherein the second integrated circuit package size is independent of the first die size; and
    further comprising:
       the lead frame interposer comprises:
          the die attach pad in a center of the lead frame interposer;
          the dual row of terminal leads, having internal terminal leads and external terminal leads, positioned around the die attach pad;
          dam bars attached to the dual row of terminal leads; and
          tie bars between the dam bars and the die attach pad;
       bond wires electrically connect the first die to the internal terminal leads; and
       the second integrated circuit package mounted on the external terminal leads, wherein the second integrated circuit package is larger than the first die.

17. The system as claimed in claim 16 wherein the dual row of terminal leads comprises the internal terminal leads and the external terminal leads are partially etched allowing the molding compound to flow around and support the leads.

18. The system as claimed in claim 16 further comprising the second integrated circuit package, having interconnect structures, mounted above the lead frame and electrically connected to the external terminal leads.

19. The system as claimed in claim 16 further comprising a QFN-like package, formed by the lead frame interposer, having a mounting surface for the second integrated circuit package above the lead frame interposer is independent of the relative die size of the two integrated circuits.

20. The system as claimed in claim 16 wherein the molding compound around the first die and the dual row of terminal leads forms solder resist regions and defines the solder wettable areas around the dual row of terminal leads.

* * * * *